(12) United States Patent
Blackwell et al.

(10) Patent No.: US 6,235,411 B1
(45) Date of Patent: May 22, 2001

(54) PROCESS FOR COATING A SUBSTRATE WITH METALLIC LAYER

(75) Inventors: Kim Joseph Blackwell, Owego; Pei Cheh Chen, Endwell; Allan Robert Knoll; Luis Jesus Matienzo, both of Endicott; Richard Dean Weale, Owego, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/266,783

(22) Filed: Jun. 28, 1994

Related U.S. Application Data

(63) Continuation of application No. 07/995,431, filed on Dec. 23, 1992, now abandoned.

(51) Int. Cl.$^7$ .............................. C23C 14/34; B32B 15/08
(52) U.S. Cl. ..................... 428/666; 428/674; 428/626; 204/192.14
(58) Field of Search ................................ 428/601, 666, 428/626, 674; 204/192.14

(56) References Cited

U.S. PATENT DOCUMENTS

| | | | |
|---|---|---|---|
| 4,466,874 | * 8/1984 | Belke, Jr. et al. | 204/192.14 |
| 4,702,963 | 10/1987 | Phillips et al. | 428/426 |
| 4,720,401 | * 1/1988 | Ho et al. | 204/192.14 X |
| 4,863,808 | 9/1989 | Sallo | 428/601 |
| 4,886,681 | * 12/1989 | Clabes et al. | 204/192.14 X |
| 4,915,494 | 4/1990 | Shipley et al. | 350/641 |
| 4,956,197 | 9/1990 | Babu et al. | 427/39 |
| 5,055,358 | 10/1991 | Livingston et al. | 428/433 |

OTHER PUBLICATIONS

Skeist "Handbook of Adhesives" 2nd Ed. (1977) Van Nostrand, pp 597–599, 612–613.*

\* cited by examiner

*Primary Examiner*—Nam Nguyen
(74) *Attorney, Agent, or Firm*—Connolly Bove Lodge & Hutz; Lawrence R. Fraley

(57) ABSTRACT

A metallic layer is coated onto a polyimide substrate by sputtering a layer of chromium followed by a layer of copper whereby the rate of deposition of the chromium is about 4 angstroms/second or less.

11 Claims, 3 Drawing Sheets

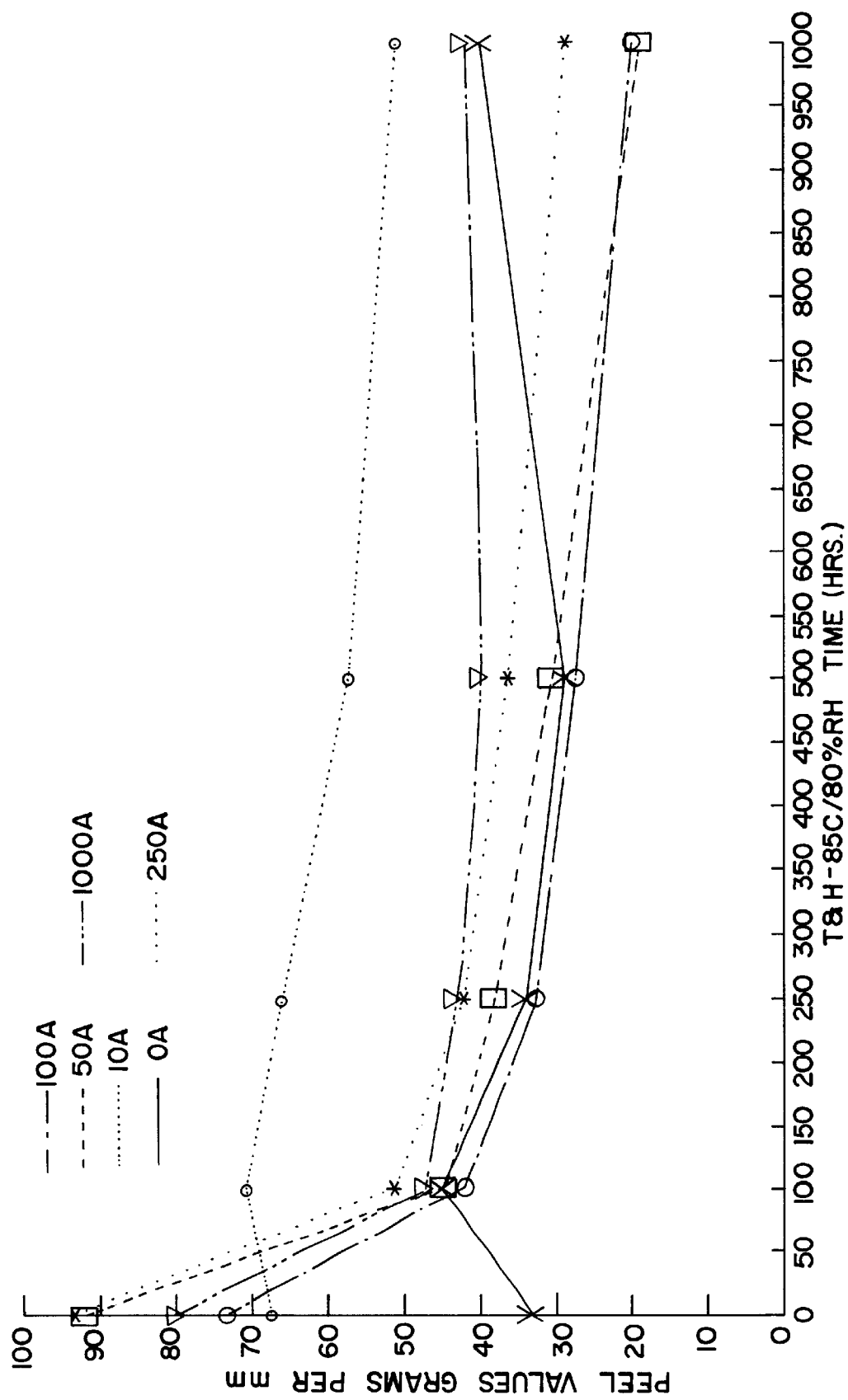

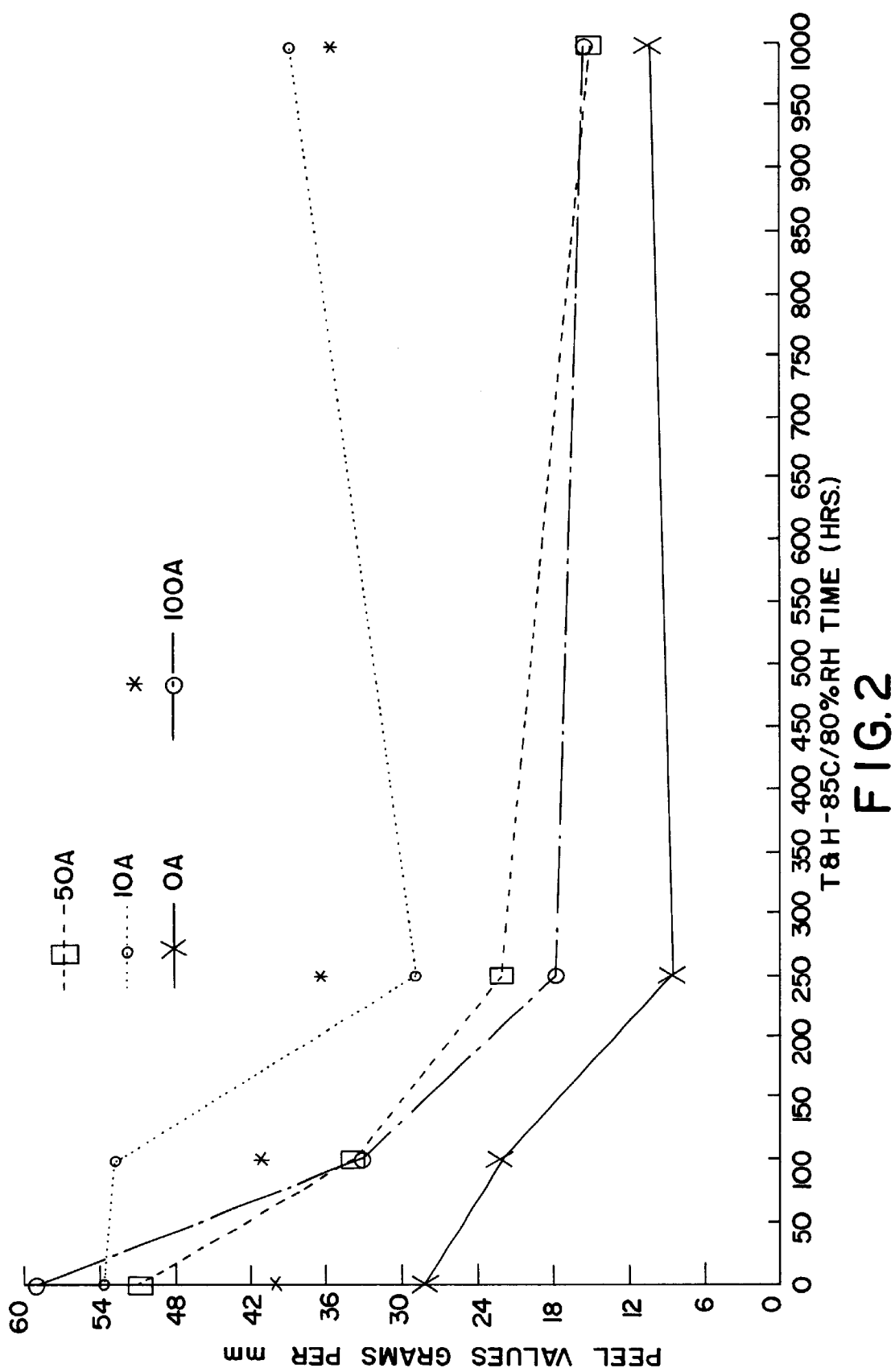

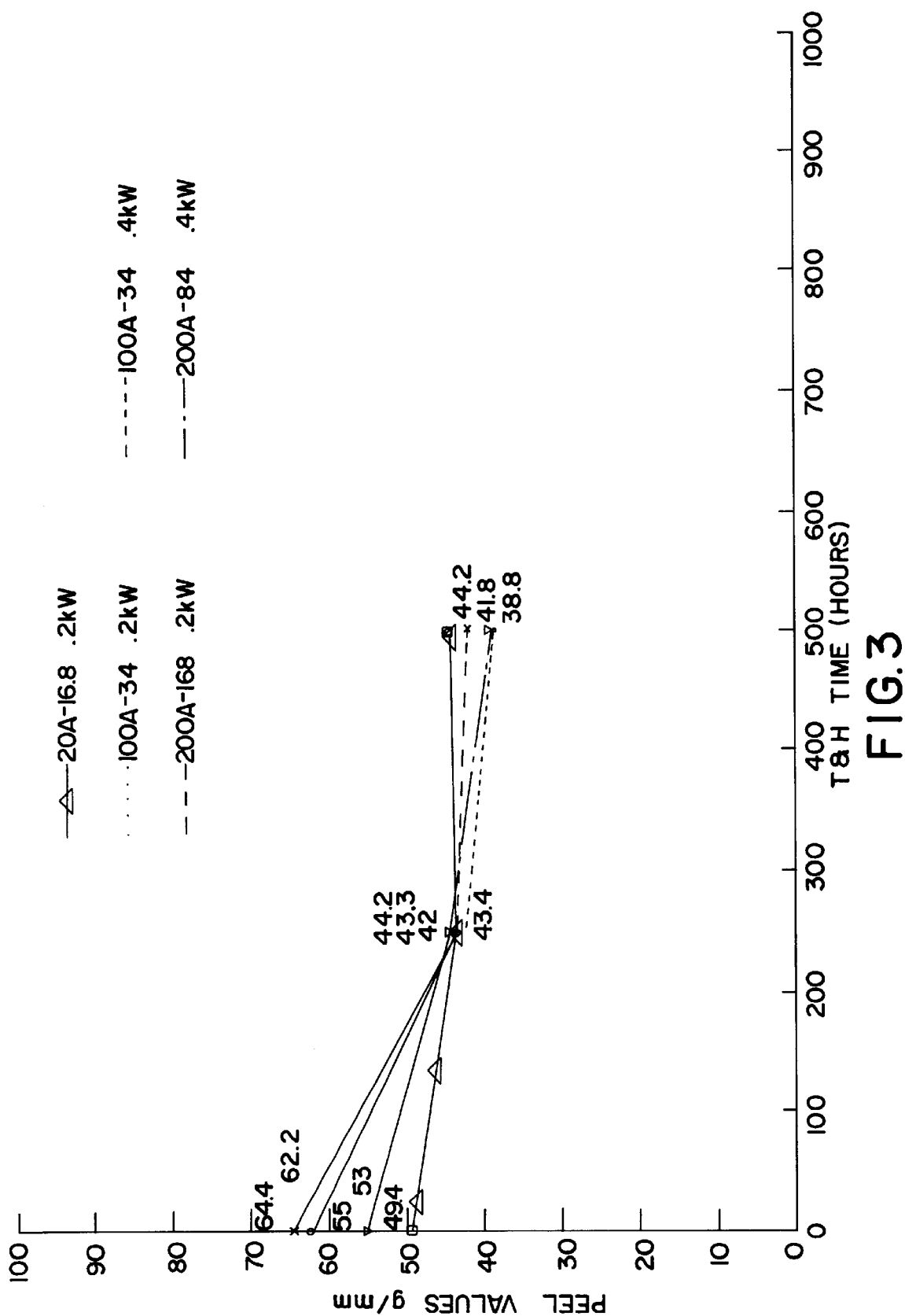

PROCESS FOR COATING A SUBSTRATE WITH METALLIC LAYER

This application is a continuation of Ser. No. 07/995,431, filed on Dec. 23, 1992 now abandoned.

DESCRIPTION

1. Technical Field

The present invention is concerned with coating polyimides of the diaryl dianhydride type with a metallic layer and particularly is concerned with providing a layer of chromium followed by a layer of copper on the substrate.

The present invention finds special applicability in the fabrication of metallized integrated circuit substrates.

2. Background Art

Polyimides are commonly employed in the electronics industry.

For instance, in the packaging of semiconductor chips, polyimide films are often used as flexible substrates or coated onto rigid substrates such as ceramics. In such instances, a pattern of metallic conductors is formed on the polyimide. Often, the conductors are at least two layers of metal being a layer of chromium followed by a layer of copper. In many instances, an additional outer layer of chromium is employed.

After deposition, the metal layers are imaged into circuits by means of photolithographic operations. Depending on the use of the circuit, the polyimide may or may not be imaged either before or after the formation of the circuit. The adhesion between the metal layers and polyimide is crucial to circuit reliability. In particular, problems have occurred resulting in lifting up of the copper line from the underlying polyimide substrate rendering the carrier unsuitable for its intended purpose.

Accordingly, the importance of improving the adhesion between such substrates and the metallic layers cannot be overemphasized.

SUMMARY OF INVENTION

The present invention is concerned with improving the adhesion of chromium layer followed by a copper layer on a polyimide substrate.

In particular, according to the present invention, the adhesion between the polyimide layer and chromium-copper layers is enhanced by depositing a layer of about 5 to about 200 angstroms of chromium by sputtering at a rate of about 4 angstroms/second or less, followed by depositing a layer of copper. It has been found pursuant to the present invention that the improved adhesion is achieved for substrates of polyimides obtained from diaryldianhydride and a diamine, by the control of the deposition rate of the chromium.

BRIEF DESCRIPTION OF THE DRAWINGS

FIG. 1 is a graph of tests evaluating adhesion strength.

FIG. 2 is a graph of tests evaluating adhesion strength.

FIG. 3 is a graph of tests evaluating adhesion strength.

FIGS. 1–3 are graphs of tests evaluating adhesion strengths.

BEST AND VARIOUS MODES FOR CARRYING OUT THE INVENTION

The polyimides used as substrates in accordance with the present invention are those polyimides obtained from a diaryl dianhydride such as biphenyl dianhydride and a diamine such as oxydianiline and preferably phenylene diamine. The diaryl dianhydride can include unsubstituted as well as substituted aryl moieties, including alkyl substituted aryl rings. A commercially available polyimide film employed pursuant to the present invention is UPILEX S® available from UBE. The process of the present invention can be applied to coated films such as spray coated films of the polyimide thermally cured on a variety of substrates.

The polyimide can be pretreated prior to coating with the chromium such as by treating in an oxygen plasma.

In order to achieve the significantly improved adhesion obtained by the present invention, it is necessary that the layer contacting the dielectric substrate be chromium and that it be deposited by Eputtering. In addition, it is critical to the success of the present invention that the rate of the sputtering not be any greater than about 4 angstroms/second. Preferably the sputtering rate is about 0.3 to about 4 angstroms/second.

Furthermore, in order to achieve the improved adhesion, it is necessary that the thickness of the chromium layer be about 200 angstroms or less, preferably about 5 to about 200 angstroms, and most preferably about 5 to about 20 angstroms.

The temperature of the polyimide substrate during the sputtering is typically about 60° C. or less.

The actual sputter apparatus to employ are well-known and need not be discussed in any detail herein.

For instance, see Microelectronic Manufacturing and Testing, Selection Guide: Sputtering Equipment, November 1987, pp. 1 and 19–22. In general, sputtering is conducted in a vacuum environment with noble gas ions such as argon being accelerated by an electric field. The resulting high-speed positive ions are then impacted on a suitable cathode target which, in the case of the present invention, is chromium. Due to the kinetic energy of the positive ions, atoms or molecules are blasted from the surface of the target material. These sputtered particles are then deposited on the desired substrate portion in the apparatus.

There are generally three basic types of sputtering techniques. In the diode mode, the target material is attached to a cathode and the substrate upon which a sputtered film is to be deposited is placed on the anode. The triode mode is similar to the diode mode, except that it also includes a hot filament. This filament generates a high-density plasma that is independent of the excitation of the target. In the macnetron mode a magnetic field is used to increase the distance which the electrons travel.

Magnetron sputtering is preferably employed in the present invention. Typically, the magnetic field is about 3 to about 450 Guass. Sputtering is typically carried out at voltages of about 200 to about 500 volts D.C. and pressures of about 0.5 to about 10 M torr.

Also the sputtering can be conducted in the presence of nitrogen gas in addition to the noble gas. Typically the amount of nitrogen when present is up to about 20% by volume.

Next, a copper layer is deposited onto the chromium coated substrate. The copper can be deposited by any technique but preferably by the same sputtering technique employed to deposit the chromium.

The copper layer is usually employed in thicknesses of about 1,000 angstroms to about 10,000 angstroms and preferably about 3,000 angstroms to about 6,000 angstroms. According to preferred aspects oE the present invention, a second layer of chromium may be sputtered onto the copper layer.

The following non-limiting examples are presented to further illustrate the present invention.

EXAMPLE 1

Onto a UBE UPILEX S polyimide web is sputter deposited about 10 angstroms of chromium using the magnetron mode with DC excitation at a rate of deposition of about 0.7–0.8 angstroms/second. The temperature of the substrate where deposition is occurring is about 0° C.±5° C.

Next copper is deposited onto the structure to a thickness of about 0.3 mils.

The copper is circuitized to provide 30 mil lines using conventional lithography. Adhesion tests are carried out according to the conventional IPC-TM-650 Method 2.4.9.

Adhesion values are taken by peeling at least five lines per sample at various exposure times of samples maintained at 85° C. and 80% relative humidity.

FIG. 1 shows the results obtained in this test as well as those for films deposited in the same manner except that the thickness of the chromium differs from the 10 angstroms thickness by virtue of employing different rates of deposition. The data points in the graph are average peel values. Typical peel strength variability is less than 5%.

EXAMPLE 2

Example 1 is repeated employing the different chromium thicknesses by varying chromium deposition rates referred to in FIG. 1. The results are shown in FIG. 2.

EXAMPLE 3

Example 1 is repeated employing the different chromium thicknesses referred to in FIG. 1 except that they are obtained by using constant deposition rates.

What is claimed:

1. A process for providing a metallic layer on a polyimide substrate which comprises providing a substrate of a polyimide from diaryl dianhydride and a diamine; sputter coating a layer of chromium of 200 angstroms or less on said substrate at a deposition rate of about 4 angstroms/second or less, and wherein the temperature of said polyimide substrate during the sputtering is about 0° C.±5° C. and resulting in improved adhesion, followed by coating a layer of copper on said layer of chromium.

2. The process of claim 1 wherein the thickness of the chromium is about 5 to about 200 angstroms.

3. The process of claim 1 wherein said deposition rate is about 0.3 to about 4 angstroms/second.

4. The process of claim 1 wherein said polyimide is from biphenyl dianhydride and phenylene diamine.

5. The process of claim 1 wherein the copper is deposited by sputtering.

6. The process of claim 1 wherein the sputtering is magnetron sputtering.

7. The process cf claim 1 wherein the sputtering is carried out at voltage of about 200 to about 500 volts D.C. and pressures of about 0.5 to about 10 M torr.

8. The process of claim 1 wherein the thickness of the copper is about 1,000 to about 10,000 angstroms.

9. The metallic coated polyimide substrate obtained by the process of claim 1.

10. The process cf claim 1 wherein the thickness of the chromium is about 5 to about 20 angstroms.

11. The process of claim 1 wherein the thickness of the copper is about 3000 angstroms and about 6000 angstroms.

* * * * *

UNITED STATES PATENT AND TRADEMARK OFFICE
CERTIFICATE OF CORRECTION

PATENT NO. : 6,235,411 B1
DATED : May 22, 2001
INVENTOR(S) : Kim J. Blackwell et al.

It is certified that error appears in the above-identified patent and that said Letters Patent is hereby corrected as shown below:

<u>Column 2,</u>
Line 14, "Eputtering" should read -- sputtering --.

Signed and Sealed this

Eighth Day of January, 2002

Attest:

Attesting Officer

JAMES E. ROGAN
Director of the United States Patent and Trademark Office